(12) United States Patent
Widzgowski

(10) Patent No.: US 8,791,402 B2
(45) Date of Patent: *Jul. 29, 2014

(54) DETECTOR APPARATUS INCLUDING LIGHT SENSOR AND ACTIVE COOLING COMPONENT WITH HEAT FLOW RUNS IN COUNTER TO THE DIRECTION OF INCIDENT LIGHT

(75) Inventor: Bernd Widzgowski, Dossenheim (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 207 days.

This patent is subject to a terminal disclaimer.

(21) Appl. No.: 13/325,087

(22) Filed: Dec. 14, 2011

(65) Prior Publication Data
US 2013/0043376 A1 Feb. 21, 2013

(30) Foreign Application Priority Data
Aug. 16, 2011 (DE) .......................... 10 2011 052 738

(51) Int. Cl.
*H01L 31/00* (2006.01)
(52) U.S. Cl.
USPC ....................................... 250/214.1; 250/238

(58) Field of Classification Search
USPC ............. 250/207, 214 VT, 214 LA, 239, 238; 257/80–84, 432–436
See application file for complete search history.

(56) References Cited

U.S. PATENT DOCUMENTS

| 3,814,964 A * | 6/1974 | Ace ................................. 313/39 |
| 6,705,388 B1 * | 3/2004 | Sorgo ........................... 165/80.3 |
| 6,818,885 B2 * | 11/2004 | Negi et al. ..................... 250/239 |
| 2011/0032614 A1 | 2/2011 | Liedtke et al. |

FOREIGN PATENT DOCUMENTS

DE   102009036006   2/2011

* cited by examiner

*Primary Examiner* — Que T Le
(74) *Attorney, Agent, or Firm* — Leydig, Voit & Mayer, Ltd.

(57) ABSTRACT

A detector device is configured to receive light and generate electrical signals. The detector device includes a housing, a detector disposed in the housing and a cooling component disposed in the housing. The cooling component is at least one of: positioned so as to have a light path extend through the cooling component, where the light path is defined by light that is received for detection; designed so as to include a thermally conductive, electrically insulating intermediate element; and disposed, in direct contact a light sensor of the detector and/or a substrate bearing the light sensor.

20 Claims, 2 Drawing Sheets

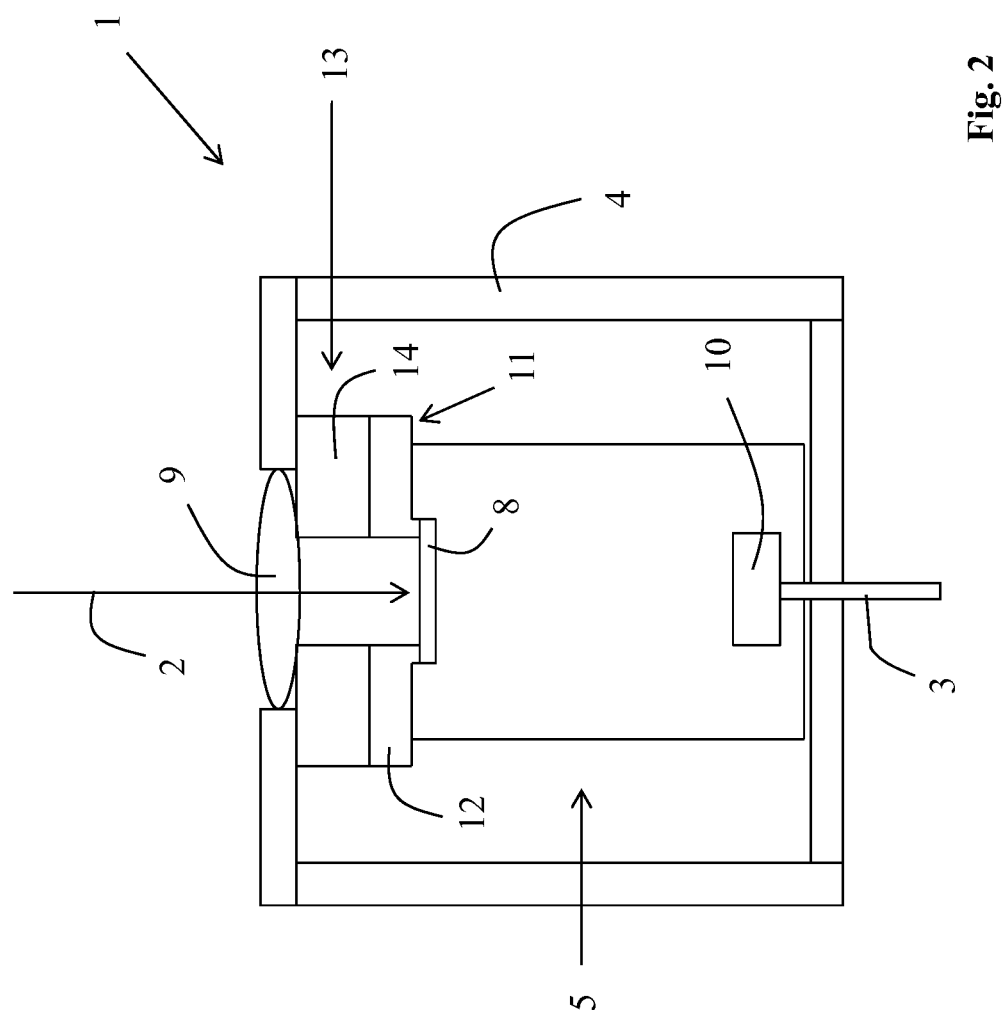

DETECTOR APPARATUS INCLUDING LIGHT SENSOR AND ACTIVE COOLING COMPONENT WITH HEAT FLOW RUNS IN COUNTER TO THE DIRECTION OF INCIDENT LIGHT

CROSS REFERENCE TO RELATED APPLICATIONS

This application claims priority to German Patent Application No. 10 2011 052 738.9, filed Aug. 16, 2011.

FIELD

The present invention relates to a detector device that is designed for receiving light and for generating electrical signals, having a housing and a detector configured therein.

BACKGROUND

Detector devices for receiving light and generating electrical signals, including a housing and a detector, often exhibit a noise-inducing, temperature-dependent dark current. Such a dark current can be reduced by cooling.

The German Patent Application DE 10 2009 036 066 A1 discusses an optoelectronic detector that has a cooling device, namely a Peltier element, that is thermoconductively connected to the detector. To prevent condensation water from forming on a surface of the optoelectronic detector, a sensor is provided for determining an instantaneous value of the ambient air humidity and of the ambient dew point temperature. The sensor is connected to a control unit that controls the cooling device as a function of the value. It is advantageous that this optoelectronic detector does not dispense altogether with a cooling. However, the actual cooling capacity is disadvantageously limited to low levels, namely to levels at which no condensation water forms. Detector noises are, therefore, not effectively prevented.

The same publication mentions another detector device where the detector, together with the cooling device, typically a Peltier element, is encapsulated in an airtight housing that is filled with a dry gas or is evacuated. In the case of this device, the waste heat can be transferred to a heat sink that is thermoconductively connected to the cooling device, and/or be used for heating other components, such as an entrance aperture of the housing. However, this detector device is recognized as being disadvantageous because of the costly air-tight encapsulation.

In practice, it actually turns out that other disadvantages are associated with this detector device. In particular, the cooling is often not very effective. Moreover, the cooling proves to be especially problematic when the detector is required to be at a different electric potential level than the housing. In such a case, the Peltier element cannot be readily configured between the housing and the detector. Such a potential difference is mostly necessary when photoelectrons are to be accelerated within the detector.

SUMMARY

In an embodiment, the present invention provides a detector device configured to receive light and generate electrical signals. The detector device includes a housing, a detector disposed in the housing and a cooling component disposed in the housing. The cooling component is at least one of: positioned so as to have a light path extend through the cooling component, where the light path is defined by light that is received for detection; a thermally conductive, electrically insulating intermediate element; and disposed in direct contact with at least one of a light sensor of the detector and/or a substrate bearing the light sensor.

BRIEF DESCRIPTION OF THE DRAWINGS

Exemplary embodiments of the present invention are described in more detail below and with reference to the drawings. In this context, all of the described and/or illustrated features constitute the subject matter of the present invention, either alone or in any useful combination, and regardless of the manner in which they are combined in the claims or antecedents thereof. In the drawings:

FIG. 2 schematically shows another detector device according to an embodiment of the present invention.

DETAILED DESCRIPTION

Figure 1:
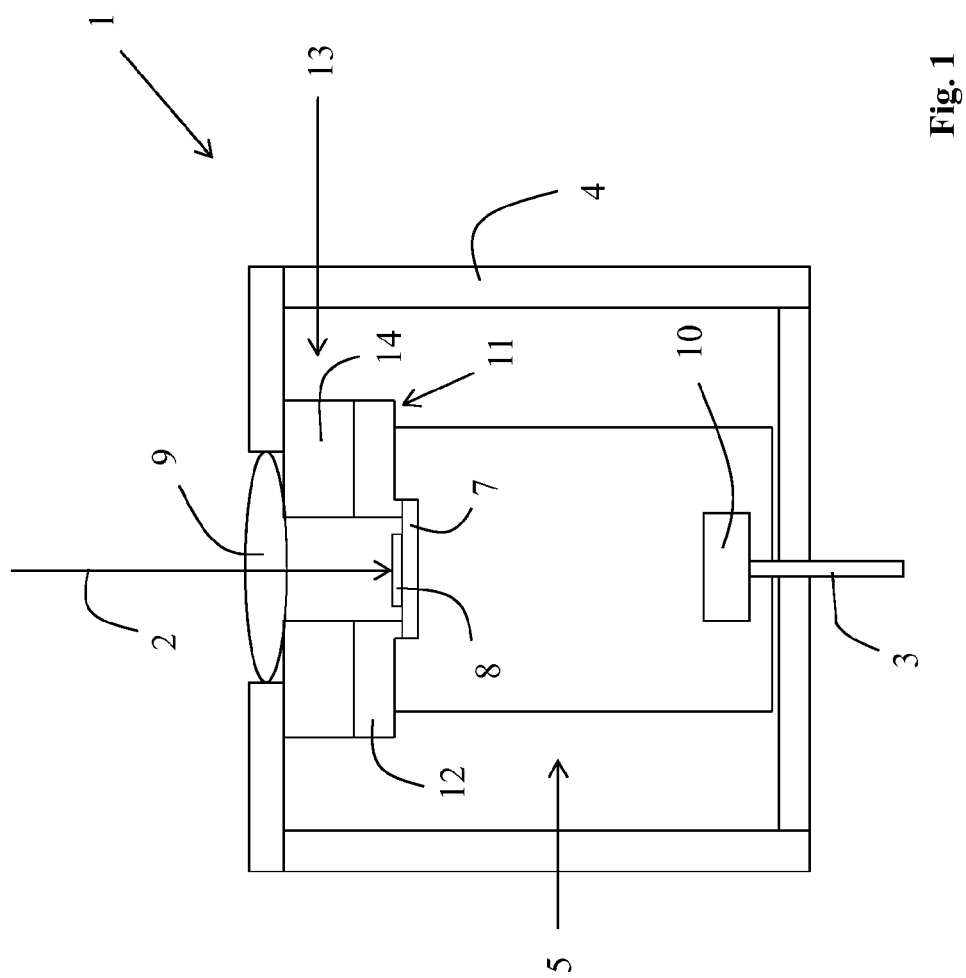
FIG. 1 schematically shows a detector device according to an embodiment of the present invention.

In an embodiment, the present invention provides a detector device that will make possible a more efficient cooling, particularly also when detectors are used that are at a different electric potential level than the housing.

In an embodiment, the present invention provides a detector device that provides more efficient cooling with a. a cooling component configured within the housing; and a light path extending through the cooling component that is defined for the light to be detected; and/or with b. a cooling component configured within the housing that is designed as a thermally conductive, electrically insulating intermediate element, and/or with c. a cooling component configured within the housing that is in direct contact with a light sensor of the detector, in particular a photocathode, and/or is in direct contact with an (in particular transparent) substrate bearing a light sensor, in particular a photocathode.

In an embodiment, another cooling component is provided within the housing. In particular, another cooling component may be advantageously provided that is in thermally conductive contact with the cooling component.

With regard to the further cooling component, it may also be advantageously provided for a light path extending through the further cooling component to be defined for the light to be detected.

To enable a light path for the light to be detected to extend through the cooling component and/or through the further cooling components, the cooling component and/or the further cooling component may feature a passage, in particular a through bore. However, it may also be provided for the cooling component and/or the further cooling component to have a two- or multipart design, the parts being mutually configured to allow an intermediate space to remain through which the light path for the light to be detected extends.

The further cooling component may also be advantageously designed as a thermally conductive, electrically insulating intermediate element. In particular, as will be described in detail later herein, the further cooling component may be designed as a passive cooling component, in particular as a heat dissipation ring that is configured between the detector and an active cooling component, respectively a Peltier element.

In an embodiment, the further cooling component may be configured to be in direct contact with a light sensor of the detector, for example a photocathode. It may also be "alternatively or additionally" provided for the further cooling component to be in direct contact with a substrate that bears a light sensor, for example a photocathode.

An especially effective cooling is attained by the direct contact of the cooling component and/or of the further cooling component with a light sensor of the detector and/or with a substrate that bears a light sensor. The advantage of such an embodiment is, in particular, that merely those components actually exhibiting temperature-dependent noise characteristics, are cooled.

Moreover, such an embodiment advantageously requires a much lower cooling capacity. This is particularly beneficial when the cooling component and/or the further cooling component is designed as an active cooling component, for example as a Peltier element. In the case that the cooling component and/or the further cooling component are/is designed as an active cooling component, less waste heat advantageously arises that needs to be transferred to the outside.

As already mentioned, the cooling component and/or the further cooling component may be advantageously designed as an active cooling component, in particular as a Peltier element, heat pump, or heat pipe. In one especially advantageous embodiment, the cooling component is designed as an annular Peltier element. Such a design advantageously enables the light path for the light to be detected to extend through the ring center, so that, when passing through the annular Peltier element, the light path is configured substantially coaxially to the axis of rotational symmetry of the annular Peltier element.

In an embodiment, the cooling component and/or the further cooling component are configured to allow the waste heat therefrom to heat at least one entrance aperture of the housing and/or an entrance optics of the housing. A special advantage of such a design is that no condensation water settles on the surfaces of the entrance aperture, respectively on the surfaces of the entrance optics, such as a lens or an array of a plurality of lenses, for example. This is ensured, in particular, by maintaining the temperature of the surfaces of the entrance aperture, respectively of the optics, above the dew point by utilizing the waste heat.

It may be advantageously provided for the cooling component and/or the further cooling component to be designed as a passive cooling component through which a heat flow takes place. It can be beneficial for the passive cooling component and/or the further passive cooling component to feature a good thermal conductivity in order to ensure a rapid heat transfer. In this respect, it may be advantageously provided for the cooling component and/or the further cooling component to feature a thermal conductivity of greater than 1 W/mK, in particular of greater than 10 W/mK, in particular of greater than 100 W/mK, and, most particularly, of greater than 500 W/mK.

In an embodiment, the passive cooling component and/or the further passive cooling component are/is shaped and dimensioned to allow an exact fit thereof over the largest possible area on the component to be cooled of the detector device, in particular on a light sensor and/or a light sensor-bearing substrate. This makes an especially effective cooling attainable. The same holds analogously if the cooling component is designed as an active cooling component, and/or if the further cooling component is designed as a further active component. However, the cooling component, respectively the further cooling component is always preferably formed in a way that does not disadvantageously degrade the function of the detector and/or of parts of the detector, for example by the vignetting of a light path.

In an embodiment that may be used, in particular, when the detector and/or parts of the detector is/are at a different electric potential level than the housing, the cooling component and/or the further cooling component are designed to be substantially electrically insulating. In particular, it may be provided that the cooling component and/or the further cooling component feature an electrical conductivity of less than 10-7 S/m, in particular of less than 10-8 S/m.

Such a variant has an advantage that the detector may be in mechanical contact with the housing via the cooling component, respectively the further cooling component, while the detector is nevertheless electrically insulated at least to the extent that permits operation thereof at the required potential level. For example, it may be provided that the detector have an acceleration device for accelerating electrons produced by a photocathode, the accelerated electrons being directed to an avalanche diode, for example. Alternatively, it may also be provided for the detector to include a secondary electron multiplier. In this respect, the situation may arise where an electrical voltage differential of several 1000 volts is required between the detector and or parts thereof and the housing.

In particular, to be able to withstand such voltage differentials, one specific embodiment of the detector provides that the cooling component and/or the further cooling component be at least partially made of an electrically insulating and thermally conductive material, in particular of boron nitride, aluminum nitride, aluminum oxide, diamond, synthetic diamond, or of a combination of these materials. On the one hand, these substances feature a high thermal conductivity and, on the other hand, a very low electrical conductivity. Moreover, the benefit is derived that these materials are simply and precisely machinable, for example by cutting, lathe turning or milling.

In an embodiment, the cooling component and/or the further cooling component can feature at least one circumferential projection or at least one circumferential groove, in particular to increase the resistance to creepage. Such a variant has the particular advantage that the creepage distance along the surface of the cooling component, respectively of the further cooling component, is lengthened, so that the risk of an electric flashover is at least diminished.

The cooling component and/or the further cooling component may be advantageously configured to be substantially annular or cylindrical. As already mentioned, this provides special benefits both with regard to the cooling component, respectively the further cooling component being brought advantageously in contact with a light sensor or a light sensor-bearing substrate, for example, for an effective cooling; on the other hand, the further benefit is derived that an opening is provided for the light path of the light to be detected.

In an effective and reliably functioning specific embodiment, the cooling component and the further cooling component are connected thermally in series. In particular, it may be provided very advantageously for the cooling component to be designed as a passive cooling component, for example as a boron nitride ring, and for it to be in direct contact with a light sensor and/or with a light sensor-bearing substrate.

Moreover, it may be advantageously provided for this cooling component to be thermally in contact with a further cooling component that is designed as an active cooling component, for example as an annular Peltier element.

The annular cooling component and the further annular cooling component are preferably disposed mutually coaxially, the light path for the light to be detected extending along the axis of rotational symmetry of the cooling component and of the further cooling component. Moreover, it may be advantageously provided for the further active cooling component, respectively the warm side of a Peltier element to be in contact with an entrance aperture or with an entrance optics of the housing. It is a feature of such a configuration that a light sensor of the detector may be cooled very effectively because a direct heat transfer takes place from the light sensor, respectively the substrate thereof, via the passive cooling component to the active cooling component. Moreover, the waste heat from the active cooling component is advantageously used to prevent condensation water from forming on the entrance aperture, respectively the entrance optics. If a substantially electrically insulating material, such as boron nitride, is used as a cooling component in this configuration, this very advantageously allows the detector to be operated at a potential level that differs from that of the housing.

In particular, to prevent condensation water from forming, it may be advantageously provided for the housing to be gastight and/or for a vacuum to be present therein. For example, it may also be provided for the gastight housing to be filled with a gas, preferably a dry gas whose dew point is especially low. For example, it may be advantageous to introduce a drying agent into the housing. It serves the purpose of removing any residual moisture still present or of absorbing ingressing moisture.

The detector device according to embodiments of the present invention may be used very advantageously with or in a microscope, in particular a scanning microscope or a confocal scanning microscope. An embodiment of a confocal scanning microscope features a plurality of detector devices according to an embodiment present invention. For example, it may be provided for different detection spectral regions to be assigned and/or assignable to the individual detector devices.

FIG. 1 illustrates a detector device 1 that is designed for receiving light 2 and for generating electrical signals at an electrical output 3. Detector device 1 has a housing 4 in which a detector 5 is located.

Detector 5 features a light sensor 6, namely a photocathode 8 that is configured on a substrate 7 and is operated in the transmission system. This means that on the side thereof facing an entrance optics 9 of housing 4, photocathode 8 receives light 2 to be detected, and, on the side facing away therefrom, emits photoelectrons.

Photocathode 8 and substrate 7 thereof are at a potential level of –8000 V, while housing 4 is at a potential level of 0 V.

Moreover, detector 5 features an avalanche diode 10 which is at a potential level of –400 V. The photoelectrons generated by photocathode 8 are in response to the potential difference existing between photocathode 8 and avalanche diode 10 and strike an avalanche diode 10 that outputs electrical signals via electrical output 3.

Within housing 4, detector device 1 has a cooling component 11 that is designed as a passive cooling component. Specifically, cooling component 11 is designed as a thermally conductive, electrically insulating intermediate element 12. Intermediate element 12 has an annular shape, the central axis of the intermediate element extending coaxially to the light path of light 2 to be detected.

Moreover, within housing 4, detector device 1 has a further cooling component 13 that is designed as an annular Peltier element 14. Annular Peltier element 14 is configured coaxially to annular intermediate element 12.

Annular Peltier element 14 is in thermally conductive contact with intermediate element 12. Intermediate element 12 is in thermally conductive contact with substrate 7.

By way of the thermally conductive, electrically insulating intermediate element 12, the cooling capacity may be utilized very effectively to cool substrate 7 and photocathode 8. Moreover, it is provided that the warm side of annular Peltier element 14 face housing 4 and entrance optics 9. In this manner, entrance optics 9 is heated once again, thereby preventing any precipitation of condensation water. The remaining intermediate space between detector 5, intermediate element 12 and annular Peltier element 14 and housing 4 is filled with a thermally and electrically insulating filling compound. The area between entrance optics 9 and photocathode 8 is filled with a dry gas.

FIG. 2 illustrates another detector device where intermediate element 12 is in direct, thermally conductive contact with photocathode 8.

LIST OF REFERENCE NUMERALS 1 detector device
2 light to be detected
3 electrical output
4 housing
5 detector
6 light sensor
7 substrate
8 photocathode
9 entrance optics
10 avalanche diode
11 cooling component
12 intermediate element
13 further cooling component

The invention claimed is:

1. A detector device configured to receive light and generate electrical signals, the detector device comprising:
   a housing;
   a detector disposed in the housing;
   a cooling component disposed in the housing, the cooling component being at least one of:
      positioned so as to have a light path extend through the cooling component, the light path being defined by light that is received for detection,
      a thermally conductive, electrically insulating intermediate element, and
      disposed in direct contact with at least one of a light sensor of the detector and a substrate bearing the light sensor of the detector: and
   a further cooling component that is at least one of disposed in the housing and disposed in thermally conductive contact with the cooling component,
   wherein at least one of the cooling component and the further cooling component is an active cooling component, and wherein the active cooling component is in thermally conductive contact with the housing and heat flow directed from the active cooling component to the housing runs counter to a direction of incidence of the received light.

2. The detector device recited in claim 1, wherein the light sensor of the detector is a photocathode.

3. The detector device recited in claim 1, wherein the light path extends through the further cooling component.

4. The detector device recited in claim 1, wherein the further cooling component is a further thermally conductive, electrically insulating intermediate element.

5. The detector device recited in claim 1, wherein the further cooling component is disposed in direct contact with at least one of the light sensor of the detector and the substrate bearing the light sensor of the detector.

6. The detector device recited in claim 1, wherein the active cooling component is a Peltier element, a heat pump or a heat pipe.

7. The detector device recited in claim 1, wherein at least one of the cooling component and the further cooling component is configured to heat at least one of an entrance aperture of the housing and an entrance optics of the housing using waste heat.

8. The detector device recited in claim 1, wherein at least one of the cooling component and the further cooling component is a passive cooling component configured for heat flow therethrough.

9. The detector device recited in claim 8, wherein at least one of the cooling component and further cooling component includes at least one of nitride, aluminum nitride, aluminum oxide, diamond and synthetic diamond.

10. The detector device recited in claim 8, wherein at least one of the cooling component and the further cooling component has a thermal conductivity greater than 1 W/mK.

11. The detector device recited in claim 1, wherein at least one of the cooling component and the further cooling component has an electrical conductivity of less than $10^{-7}$ S/m.

12. The detector device recited in claim 1, wherein at least one of the cooling component and the further cooling component includes at least one of a circumferential projection and circumferential groove configured for increasing resistance to creepage.

13. The detector device recited in claim 1, wherein at least one of the cooling component and the further cooling component is substantially annular or cylindrical.

14. The detector device recited in claim 1, wherein e cooling component and the further cooling component are connected thermally in series.

15. The detector device recited in claim 1, wherein the housing is at least one of airtight and configured to maintain a vacuum therein.

16. The detector device recited in claim 1, wherein the detector and the housing have an electrical potential difference therebetween.

17. The detector device recited in claim 1, wherein the detector includes the light sensor.

18. The detector device recited in claim 17, wherein the detector is a photocathode.

19. The detector device recited in claim 17, where at least one of an electron accelerator and an electron multiplier is disposed downstream of the light sensor.

20. The detector device recited in claim 1, wherein the detector device is associated with a microscope.

* * * * *